United States Patent [19]

Del Monte et al.

[11] 4,011,143

[45] Mar. 8, 1977

[54] MATERIAL DEPOSITION MASKING FOR MICROCIRCUIT STRUCTURES

[75] Inventors: Louis A. Del Monte, Minnetonka; Robert H. Grangroth, Buffalo, both of Minn.

[73] Assignee: Honeywell Inc., Minneapolis, Minn.

[22] Filed: July 28, 1975

[21] Appl. No.: 599,796

Related U.S. Application Data

[62] Division of Ser. No. 373,526, June 25, 1973, Pat. No. 3,897,324.

[52] U.S. Cl. .................................. 204/15; 118/505; 204/192 R; 427/282
[51] Int. Cl.² ...................... C25D 5/02; C25D 7/12
[58] Field of Search .................... 204/15, 192, 298; 427/282; 118/504, 505

[56] References Cited

UNITED STATES PATENTS

| | | | |
|---|---|---|---|
| 3,170,810 | 2/1965 | Kagan | 204/298 |
| 3,408,271 | 10/1968 | Reissmueller et al. | 209/15 |
| 3,479,269 | 11/1969 | Byrnes, Jr. et al. | 204/192 |
| 3,609,472 | 9/1971 | Bailey | 204/192 |

*Primary Examiner*—T. M. Tufariello
*Attorney, Agent, or Firm*—Theodore F. Neils

[57] ABSTRACT

To minimize the deposition of materials in portions of a microcircuit structure beyond those intended to be deposited upon through openings in a mask, a special mask holding arrangement is used. This arrangement can be used with several deposition methods which include sputtering and evaporation as well as supplementing these with plating techniques.

13 Claims, 10 Drawing Figures

MATERIAL DEPOSITION MASKING FOR MICROCIRCUIT STRUCTURES

This is a division of application Ser. No. 373,526, file June 25, 1973, now U.S. Pat. No. 3,897,324.

BACKGROUND OF THE INVENTION

This invention relates to electronic device technology and the deposition of materials on portions of a microcircuit structure through openings in a separate mask.

The use of a separate mask to control the pattern of a material deposition on a portion of a structure is well known. Openings are provided in a sheet of mask material in a pattern which corresponds to the desired pattern of selected portions of the structure upon which material depositions are to be made. Then by use of such a mask in placing it against a structure surface and depositing on the selected portions through the mask openings, materials are deposited on the structure in approximately the desired geometrical arrangement. However, the final geometrical pattern of deposited material following this deposition differs from the desired geometrical pattern to some extent since, unavoidably, some of the material deposited gets underneath the mask along the edges of the openings therein during deposition. This occurs because the sheet of mask material is not uniformly in contact with the structure surface thereby leaving gaps between the mask and the structure surface. If these gaps occur, the method chosen of depositing material on the selected portions cannot be expected to alter greatly the result that some deposited material gets underneath the edges of the mask in a relatively uncontrolled manner.

Typical items upon which material depositions are desired to be made are integrated circuit wafers and substrates which are used to mount thereupon various kinds of electronic devices. The surfaces of these structures against which a mask is to be placed are usually very flat. This, in turn, requires that the mask be very flat against the surface if there is to be uniform contact and gaps are not to occur.

Such gaps can occur for flat sheet masks which are held by a holder which does not act to alter substantially the flat geometrical shape of the mask at portions of the mask intended to be brought against a surface of the structure. These gaps will occur when the structure surface and the mask are forced against one another, even though they are symmetrically aligned with one another and even though the mask and the structure surfaces are both flat and parallel, because of the bending of the mask due to the resultant forces acting on it due to the structures surface pressing against it and due to the mask holder constraining the edge of the mask. Failure of symmetrical and/or parallel alignment or deviations in flatness in the mask sheet itself, all difficult to avoid, are further sources of or aggrevations of such gaps. It is therefore desirable to have the mask and the structure surface placed in contact with one another in such a way as to minimize the formation of such gaps.

SUMMARY OF THE INVENTION

A mask in the form of a sheet of material having openings therein is provided in a flexed form to result in one of its major surfaces being substantially convex. The mask as flexed is positioned with this convex major surface force biased against a surface of a structure, the structure having selected portions therein upon which a material is to be deposited. The mask openings are provided in registration with corresponding ones of these selected portions. Means for such flexing and such force biasing are provided by a mask and structure holding apparatus.

This method of masking a structure surface to receive a deposition can be used with many deposition techniques. Some of these techniques for forming depositions in a pattern are sputtering, sputtering followed by plating and evaporation followed by plating.

DESCRIPTION OF THE PREFERRED EMBODIMENTS

Figure 1:
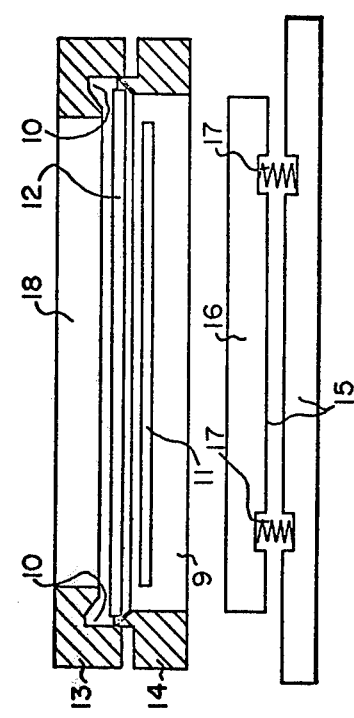
FIG. 1 shows an apparatus for accomplishing the masking of the present invention.

FIG. 1 shows an apparatus for providing a mask 12, formed as a more or less flat sheet of material having openings therein, in a flexed form against the surface of a structure, here integrated circuit wafer 11. The wafer has selected portions therein, corresponding to the mask openings, upon which material depositions are to be made. Using this apparatus to flex the mask and to force bias the mask and a major wafer surface against one another minimizes the amount of deposited material which unavoidably gets beneath the edges of the openings of the mask during a deposition. The deposited materials are typically metals for forming contact electrode bumps or electronic device interconnection pathways. Further, the apparatus eases the requirements for matching the mask and the wafer to achieve registration when the two are brought against one another.

The mask 12, typically a metal mask made from a molybdenum sheet, has forces applied by the apparatus to it such that the molybdenum sheet is flexed into a protrudent shape with the resulting substantially convex major surface directed toward a surface of wafer 11 against which the mask is to form a seal. The protrudent shape of the mask is modified to some extent by the force occurring between the structure and the mask when they are brought together.

Figure 2:
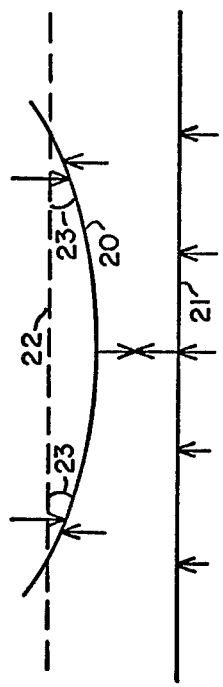
FIG. 2 is a force diagram indicating forces acting on a mask and on a structure to be masked.

FIG. 2 shows a somewhat simplified force diagram indicating the forces on the mask and on the structure as the two are brought against one another. The upper curve 20 represents the mask and the lower line 21 represents the wafer. Dotted line 22 represents the plane in which the mask would lie were it not being flexed by the opposing pairs of forces shown at either end of the mask curve 20. The downward pointing force in each opposing pair of forces is shown acting on the resulting concave surface of the mask curve 20. The upward pointing force is shown acting on the resulting convex surface. Other force combinations are possible such as having the upward pointing force in an opposing pair acting to pull on the concave surface rather than pushing on the convex surface.

The final shape of the mask in use, i.e. the shape of curve 20 after the mask and the wafer are brought against one another, is determined to a major extent by whatever force level is chosen to occur between the mask and the wafer in forcing these two items against one another. A combination of this force, the springiness of the mask material, the breadth of the mask relative to the breadth of the wafer and the amount of flexing of the mask can be found which results in little gap occurring between the mask and the wafer surface.

The amount of flexing for a particular mask is determined by the angle 23 of FIG. 2. A typical set of parameters is to have angle 23 fixed at about 10° and to have a molybdenum circular sheet for the mask of a two inch diameter, approximately, and of a thickness of about 0.004 inches. A standard integrated circuit wafer is used being about 1¾ inches in diameter but larger wafers can be used with larger masks. Properly adjusting the force of a wafer against such a flexed mask will result in minimizing the amount of deposited material getting under the edges of the openings of the mask during a deposition of the material, i.e. a good seal will be obtained.

An additional advantage ensues in flexing the mask in this fashion against a substantially flat structure, the wafer here, when contrasted to positioning against the structure a mask which is merely a flat sheet of material held flat rather than flexed by its holder. For this latter case of an unflexed mask, if any portion of the wafer is forced against the metal mask before some other portions of the wafer engage the mask, due to non-parallel alignment between the mask and the wafer, the flat metal mask will be distorted nonsymmetrically into a protrudent shape pointing away from the wafer. The result is that gaps form at the interface between the mask and the wafer.

Again, even though there is sufficiently parallel alignment between the mask and the wafer, the mask can be distorted nonsymmetrically if the wafer engages the mask toward the edge of the mask near where the mask is being constrained by its holder rather than engaging the mask with the centers of the mask and the wafer more or less aligned. This engagement of the mask off center by the wafer can occur easily in an integrated circuit having a chip design repeated in a pattern across the face of the wafer. For deposition, the mask and the wafer must be brought together in registration, i.e. the mask hole pattern, provided as a repeated chip hole pattern with respect to a particular chip design, must expose properly the selected portions of each chip contained integrally in the wafer, the selected portions upon which deposition of materials is to occur. The wafer, when brought into registration with the mask on an individual chip basis, can easily be shifted one or more chip widths in the repeating pattern from a position of symmetrical center alignment with the mask.

Flexing the mask to provide a protrudent shape with the resulting convex major surface directed toward the wafer as described above relieves these problems substantially. The engagement of the curved surface of the unflexed metal mask by the wafer will always occur first near the center of the mask at a point where the curvature of the mask is nearly the same as at the mask center. This is true despite the occurrence of some non-parallelness between the wafer and the plane of the mask in an unflexed state and/or despite the wafer axis not meeting in alignment the mask axis upon the two coming together. Hence, the interface characteristics between the mask and the wafer are about what they would have been without the occurrence of non-parallelness or off center engagement.

The result is that forcing the wafer against the mask with about the same degree of force modifies the mask curve or shape in approximately the same way as would occur in the absence of these irregularities of alignment and engagement. Thus, the use of the same degree of force between the mask and the wafer, i.e. using the apparatus without further adjustment, whether these irregularities occur or not, results in approximately the same good seal between the mask and the wafer.

Returning now to FIG. 1, the apparatus for holding the mask and the wafer is shown in the situation prior to forcing together the circular mask and the wafer. The wafer 11 is forced against the mask 12 by wafer pressure plate assembly 15 acting through opening 9. Force is transmitted to pressure plate 16 by springs 17. The mask 12 is flexed by pressing mask retainer 13 against the stop 14 with mask 12 pressed between them in groove 10. When such pressing occurs, the outer edge (exterior) portions of mask 12 will be forced upward and away from wafer 11 while portions of the mask interior to these outer portions will be forced downward toward wafer 11. This combination of forces will cause the metal mask to flex becoming protrudent in a direction toward wafer 11.

The convex curve of the resulting substantially convex major surface of mask 12 will be modified by the force occurring between the wafer 11 and mask 12 due to the force supplied through pressure plate 16. The stop 14 limits the pressure applied through pressure plate assembly 15 to a desired level of reactive force between the mask and the wafer. Deposition will occur through the opening 18 in mask retainer 13 above mask 12.

The above apparatus with the mask and the wafer therein can be placed in a deposition chamber for the deposition of materials onto the wafer through the openings in the mask and the opening in mask retainer 13. The apparatus has been found to work well with methods described in a copending application by Del Monte, one of the inventors herein, assigned to the same assignee and having Ser. No. 365,778, that application hereby made reference to and incorporated herein to indicate the background of the art. The methods described therein using a mask for deposition are set out below. The methods as described are particularly directed toward the formation of contact electrode bumps on an integrated circuit wafer but these methods have further applications and the masking described above can be used therein.

Figure 3:
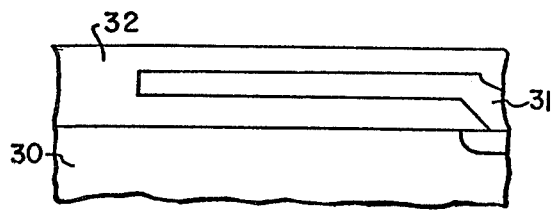
FIGS. 3 through 7 show the results of steps in the sputtering process leading to contact electrode bumps.

To begin the description of these methods, consider FIG. 3 which shows a portion of a monolithic integrated circuit wafer after metallization and passivation and before processing has been begun to place contact electrode bumps on an interconnection network. Silicon material 30 is shown supporting aluminum electronic device interconnection network 31 which is shown making a connection to silicon layer 30. Interconnection network 31 for the most part is supported on silicon dioxide layer 32 and is also covered by silicon dioxide layer 32 which is provided for passivation and protection.

Figure 4:
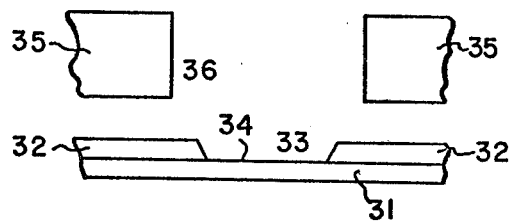

FIG. 4 shows an opening 33 made in silicon dioxide layer 32 for exposing a selected portions 34 of the interconnection network 31. Silicon portion 30 of FIG. 3 has been omitted from the remaining drawings since it does not have a direct role in the process described herein. Opening 33 can be provided by well known etching methods followed by the sputter-cleaning step set out below. Opening 33 may be made entirely by the methods of the sputter-cleaning step in some circumstances. These are situations in which it may be desirable to form bumps on portions of the structure which are not part of an interconnection network. Then the metal 31 would not be part of an interconnection network and indeed, with the proper choice of materials for forming the bump, a bump might be formed on silicon or on silicon dioxide or other material so that no metal would need to be provided where aluminum metal 31 is shown.

Also shown in FIG. 4 is a portion of a metal mask 35 having a protrudent shape as described above, still separated from but about to be forced against the structure comprising the silicon dioxide layer 32, the interconnection network 31 and the now omitted silicon. The opening 36 in the mask is to be placed in substantial concentricity with the selected portion of the interconnection network 34 and so with opening 33, leaving some of the silicon dioxide 32 exposed. The mask material is molybdenum sheet.

Figure 5:
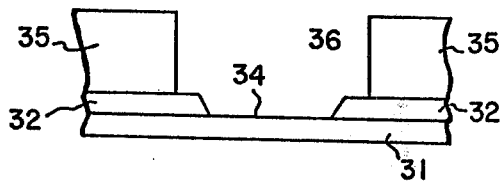

FIG. 5 shows metal mask 35 in place against silicon dioxide layer 32. At this point in the process, the sputter-cleaning step, noted above to occur after etching, is performed. This step is performed to remove silicon dioxide residues, metal oxides and any other contaminents on selected portion 34 of interconnection network 31 to first completely expose this selected portion and to remove contaminents from the surface of silicon dioxide layer 32 remaining exposed in opening 36 in the mask 35. This cleaning will be performed inherently in those circumstances where opening 13 is provided by sputter-cleaning methods. Performance of an effective cleaning here removes the need for a sintering step later in the process if very low contact resistance is desired. The sputter-cleaning is performed in the vacuum chamber of a sputtering apparatus wherein the wafer is masked above is positioned. A standard sputtering apparatus of the type used in making thin film depositions generally is satisfactory.

The vacuum chamber is pumped down and an inert gas atmosphere is placed therein, usually argon, although other gases or gaseous mixtures can be used in this and other circumstances including, in some situations, gases which are not inert. A continual flow of argon through the vacuum chamber by bleeding off and adding helps to remove and so reduce contaminents formed therein during sputtering. This vacuum pumpdown and provision of a selected gas atmosphere occurs only once during the sputtering steps in this process. The ordinary atmosphere is not admitted to the chamber after the initial pump-down preceding the use of sputter-cleaning kinds of steps until the metal sputtering steps have been completed. In general, the pressure of the selected atmosphere for the chamber need never approach ordinary atmospheric pressure after the initial pump-down, i.e. initial major pressure reduction, until sputtering is completed. This performance of the sputtering steps during a single provision of a selected atmosphere strongly aids the prevention of contamination of exposed surfaces occurring during the sputtering steps in the process. Generally, time consuming additional pump-downs are avoided during processing.

An inactive electrode is contained in the vacuum chamber as are source electrodes, each of the latter having a type of metal provided in it which is desired to be deposited through the opening 36 of metal mask 35. For sputter-cleaning, a sufficiently large potential is applied between the inactive electrode and the wafer structure, the wafer being negative with respect to the inactive electrode, to cause ionization of the argon gas between the inactive electrode and the wafer structure. The resulting argon ions then impinge on the wafer structure with sufficient momentum to remove surface particles thereon and atoms therein. This impingement of argon ions is continued until some hundreds of angstroms (on the order of 300 A) of the silicon dioxide, silicon dioxide residue metal oxides and/or aluminum have been removed following etching. The partial pressure of the argon gas for the cleaning operation is typically 20 to 40 microns of mercury.

After the cleaning operation, the first type of metal desired to be deposited through opening 36 in metal mask 35 and onto selected portion 34 is then sputtered both onto this area and onto those portions of silicon dioxide layer 32 exposed in openings 36. To sputter a selected metal, a sufficient potential is applied between the inactive electrode and the source electrode (source electrode negative during times metal is sputtered) having this metal therein to ionize the gas in the vacuum chamber between these two electrodes. Again, this gas is argon and the earth's atmosphere is not admitted to the chamber between the sputter-cleaning step and the sputtering of metals. The masked wafer is placed near or on the inactive electrode (in the cathode dark space) with the areas on which the deposit is to occur facing the source electrode.

Sputtering can be carried out using direct (DC) voltage or with radio frequency (RF) voltage and with the target upon which the sputtering deposition is to occur either having or not having a direct voltage bias with respect to the anode, the anode usually being at ground potential. DC voltage sputtering, while convenient from a power supply point of view, must be carried on at relatively high pressures of gas atmosphere, here argon, in the sputtering chamber. Such sputtering can be performed in a pressure range of 10 to 100 microns of mercury considering special circumstances, but typically it is carried on at from 40 to 50 microns of mercury. RF voltage sputtering, on the other hand, is usually carried on at less than 20 microns of mercury as an operating pressure. Since higher pressures of gas means more of the sputtered metal is diverted in passage to the target, higher gas pressure in the sputtering chamber leads to decreasing efficiencies in the amount of metal reaching the proper locations versus the amount of metal sputtered from the target.

Operating the target upon which a sputtering deposition is to occur at a bias with respect to the anode can improve adhesion because of the target scrubbing action the ions attracted to the target have upon it. Here again, however, this leads to a reduced efficiency in the use of the metal sputtered.

Thus, RF voltage sputtering is often preferred where expensive metals are to be sputtered onto a target because of its higher efficiency in the use of such metals. Further, RF voltage sputtering permits use of insulating targets, such as a substrate upon which contact electrodes are to be formed, as well as targets which are conductors, as here where the target is a masked wafer having conductive openings exposed.

In this arrangement, the atoms ejected from the source electrode, due to the impingement of argon ions, have a strong tendency (1) to be directed toward the inactive electrode and the masked wafer and (2) to strike them with a fairly substantial velocity, a much higher velocity than occurs on striking a wafer structure due to an evaporation deposition. This provides two substantial advantages for the sputtering of contact electrode bumps where a major portion of a bump consists of an expensive metal.

The first advantage is due to the relatively high directivity of the ejected source electrode atoms toward the wafer structure. This results in a much larger fraction of the metal supplied from a source being deposited on the wafer structure rather than on other surfaces in the deposition chamber when compared to evaporation. In turn this means that a much smaller amount of an expensive metal required to be deposited is wasted.

The second advantage comes about because of the relatively high velocity at which the ejected atoms strike the wafer structure. The process tends to be self-cleaning as it proceeds due to the high velocity impact of atoms tending to clean away contaminents and to clean away poorly bonded atoms of the metal ejected from the source electrode which have been previously deposited. This in turn results in the contact electrode bumps having a substantially greater adhesion to the wafer structure and greater adhesion between its constituents through each layer of bump metal which has been deposited by sputtering.

Figure 6:
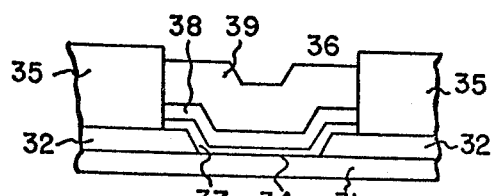

As shown in FIG. 6, chromium is the first metal deposited by sputtering to form layer 37 on selected portion 34 and on the exposed portions of silicon dioxide layer 32. Chromium exhibits a strong adhesion to both aluminum and to silicon dioxide which is the basis for choosing it for the first layer. Typically, a chromium layer of 1500 A is provided.

The next layer of metal, copper, shown as layer 38, is typically deposited in a codeposition with the last 500 A of the chromium layer to create a dual phase layer of chromium and copper. This dual phase layer is not separately shown in FIG. 4 and generally is not necessary though helpful in providing good adhesion between the layers. The codeposition is ended with the completion of the chromium layer 37 to the desired height and an all copper layer 38, of up to 5000 A is thereafter deposited by sputtering. This copper layer adheres well to the chromium and to the third layer of metal to be used, gold. Both the copper layer 38 and the chromium layer 37 act to limit metallic diffusion so that the materials underlying these respective layers are prevented from forming undesirable intermetallic compounds with the gold. Other metals may be used for either of these layers, particularly substituting either nickel or silver for copper.

The third layer to be deposited by sputtering is gold. When sputtering is to be the only method of metal deposition used to form the contact electrode bumps, which is the case shown in FIG. 6, gold is sputtered to the desired height of the contact electrode bump. The bump height is a minimum of about 0.2 mil if proper bonding is to be achieved since the pressure and heat of bonding will cause the bump to collapse a tenth of a mil or so. A more desirable bump height for bonding would be 0.5 mil.

Figure 7:
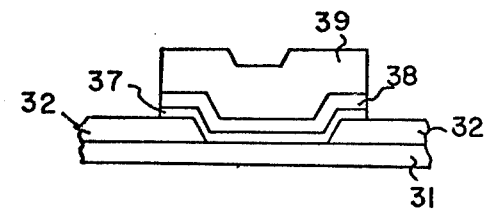

The masked wafer is then removed from the vacuum chamber of the sputtering apparatus and the mask in turn is removed from the wafer. Removal of the mask must occur in a direction perpendicular to the wafer surface to avoid shearing off any of the now formed contact electrode bumps. The wafer is then placed in an etching solution for a slight etch to remove any gold metal which may have "sprayed" under the mask during the sputtering of the gold. The wafer is then rinsed in deionized water. The result is shown in FIG. 7.

While sputtering is a more efficient way to deposit metal for contact electrode bumps in saving on the metal used than is evaporation, in the case of an expensive metal it may still be desirable to further reduce loss of the metal which occurs because of its not being deposited where only needed on a structure. Plating-on an expensive metal can improved on the efficiency of its use and any "misdirected" or excess metal can be etched away and recovered from the etching solution used in the plating process. However, it is still possible to sputter layers of other metals on the selected areas of the interconnection network before the expensive metal is plated-on to provide a metal layer plating base so that both sputter-cleaning and the better adhesion properties of metals deposited by the sputtering process can be retained. These small, scattered selected areas on which the metal bases are formed confine any microcracking to occurring approximately only in surfaces which will be covered by the bumps upon completion since the plated metal is to adhere only to these metal bases to complete the bumps.

Figure 8:
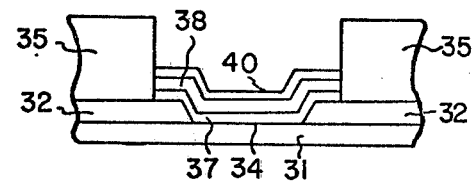
FIGS. 8 through 10 show the results of steps in the supplementary plating process leading to contact electrode bumps.
Figure 9:
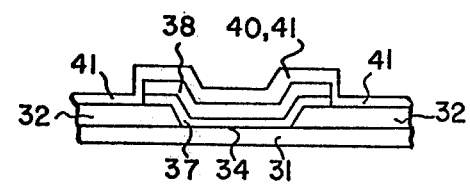

To supplement the above described sputtering process by the addition of plating steps, only a thin layer of gold 40 is sputtered on copper layer 38 as is shown in FIG. 8 rather than sputtering gold until the desired bump height is reached as was shown in FIG. 6. The metal mask 35 is then removed and, in a first plating method, a very thin gold flash layer is sputtered on the entire surface of the wafer. This very thin layer will not cause microcracking. The gold flash layer combines with the sputtered gold layer 40 and is shown as layer 40, 41 in FIG. 9. Electroplating is used in this first plating method and the need to join all of the metal layer plating bases into one electrode for plating purposes requires providing gold flash layer 41.

Figure 10:
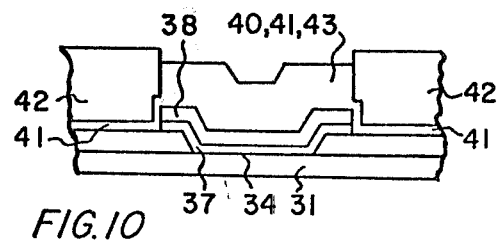

A photoresist layer 42 is then provided on the gold flash layer by standard methods and an opening is provided in the photoresist layer over the deposited layers of chromium 37 and copper 38 as well as the portion of gold layer 40, 41 positioned over copper layer 38 as shown in FIG. 10. Using standard electroplating techniques, gold is then plated onto the exposed gold layer 40, 41. The gold supplied in this plating process will adhere only to the gold layer 40, 41 and will not plate or adhere to the photoresist layer 42. Gold is plated to the desired height of a contact electrode bump to form gold layer 40, 41, 43.

The photoresist layer 42 is then removed by standard methods. The gold flash layer 41 is next etched away except where covered by the plated-on gold forming the bump. A small portion of the plated-on gold is also etched away. Little microcracking is exposed for this etching to reach and, since also very little etching is required to remove the very thin flash layer, no significant etching of the interconnection network occurs. No sintering is required as is otherwise required if relatively low electrode resistance is desired because of the sputter-cleaning step performed prior to the sputtering on of chromium layer 37. The resulting bump is approximately the same as that shown in FIG. 7.

A second plating method, alternative to the above electroplating method, is available which is somewhat less efficient in the use of gold but which eliminates the providing of a metal flash layer and the providing of a photoresist layer. This alternative method uses standard electroless plating or chemical plating techniques. Such techniques are not, as so far developed, fully satisfactory in providing all of the gold (meaning gold beyond that needed in forming a metal base) for a full 0.5 mil gold contact electrode bump but can be satisfactorily used to provide the last 0.2 or 0.3 mil of the gold needed to form such a bump. Additional sputtering of gold is required to provide the first 0.2 mil or so of gold prior to the electroless plating step. The additional sputtering reduces to some extent the efficiency in use of gold achieved by the above electroplating method.

To use electroless plating, the same steps which are performed in providing an entirely sputtered bump are repeated except the process is terminated before the last 0.2 or 0.3 mil of gold used in constructing the bump has been sputtered into place. At this point, referring to FIG. 6, gold layer 39 would be thinner than shown in FIG. 6 by the 0.2 or 0.3 mil desired to be formed by electroless plating. The sputtering of gold is then terminated at this point and metal mask 35 is removed. The wafer is then immersed in a chemical plating bath and gold is thereby plated on the gold already sputtered on to provide the contact electrode bump approximately shown in FIG. 7. The gold will not chemically plate onto the silicon dioxide layer 32 which has an unactivated surface. Thus, though the sputtering of gold provides a larger fraction of the gold in the contact electrode bump than it does in the electroplating method, the steps of providing a metal flash layer and of providing a photoresist layer have been eliminated.

Using the same supplementary plating steps of either of the above plating methods but having the metal base structure, comprising layers of chromium 37, copper 38 and gold 40 shown in FIG. 8, or some other metal base structure placed there by use of well known evaporation deposition methods will provide a process having nearly the same efficient use of gold. A plated gold bump will be provided on a satisfactory metal base. If sputter-cleaning is used prior to evaporation, sintering after the completion of the plating steps can usually be avoided also in providing a relatively low electrode resistance if desired. Other methods may be used in some circumstances for providing the metal bases on a structure upon which to plate bumps such as "printing" through screens or masks. Deposited structures other than contact electrode bumps may be provided by supplementary plating methods such as electronic device interconnection pathways.

Bumps may be provided on many kinds of microcircuit structures other than integrated circuit wafers by the methods described herein with substrates upon which various kinds of electronic components are to be mounted, including integrated circuit chips, being a typical example.

Deposition of materials to form patterns of deposited materials on microcircuit structures other than contact electrode bumps may be made. These might be, as an example, metal pathways or pads.

The embodiments of the invention in which an exclusive property or right is claimed are defined as follows:

1. A method for providing deposition materials on a microcircuit structure through a separate mask provided as a sheet of a mask material having deposition openings therein, said method comprising:
   flexing said mask toward a substantially protrudent shape while forcing a major surface thereof, which tends toward being substantially convex as a result of said flexing, against a first surface of said structure sufficiently to provide sealing around said deposition openings, and
   depositing said deposition materials.

2. The method of claim 1 wherein said flexing is accomplished by applying a first force, directed toward said structure, to a resulting substantially concave major surface of said mask at interior portions of said mask which are interior to exterior portions of said mask and applying a second force to said convex major surface of said mask at said exterior portions directed away from said structure.

3. The method of claim 1 wherein said flexing is accomplished by applying a first force, directed toward said structure, to a resulting substantially concave major surface of said mask at interior portions of said mask which are interior to exterior portions of said mask and applying a second force to said concave major surface of said mask at said exterior portions directed away from said structure.

4. The method of claim 1 wherein said flexing is preceded by registering said mask and said structure with one another.

5. The method of claim 1 wherein said flexing is accompanied by registering said mask and said structure with one another.

6. The method of claim 1 wherein said depositing occurs in a deposition chamber provided with one or more sources each capable of supplying one of said deposition materials which is selected to be deposited, said deposition being accomplished by:
   providing said structure and said mask in said deposition chamber with said mask located with respect to said structure in a manner such that said deposition openings are located substantially concentric with selected portions of said structure; and
   depositing each of said deposition materials through said deposition openings in a selected order for a time sufficient to obtain, through said deposition openings, a selected amount of each of said deposition materials, whereby a pattern of said deposition materials on said structure results.

7. The method of claim 1 wherein said depositing occurs in a deposition chamber provided with one or more sources each capable of supplying one of said deposition materials which is selected to be deposited, said depositing being accomplished by:
   providing said structure and said mask in said deposition chamber with said mask located with respect to said structure in a manner such that said deposition openings are located substantially concentric with respect to selected portions of said structure;
   depositing each of said deposition materials through said deposition openings in a selected order for a time sufficient to obtain, through said deposition openings, a selected amount of each of said deposition materials;
   removing said mask to leave a structure resultant surface; and
   plating a plated metal layer on said deposition materials as deposited, whereby a pattern of said deposition materials underlying said plated metal layer results on said structures.

8. The method of claim 6 wherein said depositing is preceded by providing a low pressure gas atmosphere in said deposition chamber and said depositing is accomplished by sputtering.

9. The method of claim 6 wherein said depositing is accomplished by evaporation.

10. The method of claim 7 wherein said depositing is preceded by providing a low pressure gas atmosphere in said deposition chamber and said depositing is accomplished by sputtering.

11. The method of claim 7 wherein said depositing is accomplished by evaporation.

12. The method of claim 8 wherein said depositing is preceded by and said providing of a low pressure gas atmosphere is followed by sputter-cleaning to expose said selected portions through said deposition openings.

13. The method of claim 10 wherein said depositing is preceded by and said providing of a low pressure gas atmosphere is followed by sputter-cleaning to expose said selected portions through said deposition openings.

* * * * *